(12) United States Patent
Grätz et al.

(10) Patent No.: US 8,853,945 B2
(45) Date of Patent: Oct. 7, 2014

(54) FLEXIBLE IMPEDANCE MATCHING FOR A MICROWAVE GENERATOR SUPPLIED WITH PULSE CURRENT

(71) Applicants: Robert Grätz, Baiersdorf (DE); Oliver Heuermann, Adelsdorf (DE); Sven Müller, Urbich (DE); Martin Schön, Neumarkt (DE); Stefan Willing, Jena (DE)

(72) Inventors: Robert Grätz, Baiersdorf (DE); Oliver Heuermann, Adelsdorf (DE); Sven Müller, Urbich (DE); Martin Schön, Neumarkt (DE); Stefan Willing, Jena (DE)

(73) Assignee: Siemens Aktiengesellshaft, München (DE)

( * ) Notice: Subject to any disclaimer, the term of this patent is extended or adjusted under 35 U.S.C. 154(b) by 69 days.

(21) Appl. No.: 13/679,754

(22) Filed: Nov. 16, 2012

(65) Prior Publication Data
US 2013/0127337 A1 May 23, 2013

(30) Foreign Application Priority Data
Nov. 17, 2011 (DE) .......................... 10 2011 086 551

(51) Int. Cl.
*H01J 23/00* (2006.01)
(52) U.S. Cl.
CPC ...................................... *H01J 23/00* (2013.01)
USPC ......................................... 315/39.51; 315/71
(58) Field of Classification Search
CPC ....................................................... H01J 23/00
USPC .......................................... 315/39, 39.51, 71
See application file for complete search history.

(56) References Cited

U.S. PATENT DOCUMENTS

| 5,656,873 | A | * | 8/1997 | O'Loughlin et al. | ......... 307/106 |
| 6,522,076 | B2 | | 2/2003 | Goedicke et al. | |
| 7,755,217 | B2 | | 7/2010 | Heuermann | |
| 7,811,941 | B1 | | 10/2010 | Becker et al. | |
| 2004/0055881 | A1 | | 3/2004 | Christie | |
| 2012/0068603 | A1 | * | 3/2012 | Itoh et al. | ................. 315/111.41 |

FOREIGN PATENT DOCUMENTS

| DE | 26 32 726 | | 2/1977 |
| DE | 26 29 979 | | 6/1977 |
| DE | 199 33 842 | A1 | 2/2001 |
| DE | 100 15 244 | A1 | 10/2001 |
| DE | 10 2006 060 417 | A1 | 7/2008 |

OTHER PUBLICATIONS

German Office Action dated Jul. 3, 2012 for corresponding German Patent Application No. DE 10 2011 086 551.9 with English translation.

* cited by examiner

*Primary Examiner* — Don Le
(74) *Attorney, Agent, or Firm* — Lempia Summerfield Katz LLC

(57) ABSTRACT

A method for operating an arrangement of equipment that include a pulse generator for generating electrical pulses, a microwave generator with a break-through voltage, and a transmission element is provided. For transmission of the pulses, the pulse generator is connected to the microwave generator via the transmission element, which in the arrangement of equipment, acts as an impedance varying over time. The voltage characteristic over time or the current characteristic over time of each pulse is defined such that in an operating mode, the impedance of the transmission element is matched to the impedance of the microwave generator when the break-through voltage is reached.

20 Claims, 4 Drawing Sheets

FLEXIBLE IMPEDANCE MATCHING FOR A MICROWAVE GENERATOR SUPPLIED WITH PULSE CURRENT

This application claims the benefit of DE 10 2011 086 551.9, filed on Nov. 17, 2011, which is hereby incorporated by reference.

BACKGROUND

The present embodiments relate to an arrangement of equipment with a microwave generator and a pulse generator connected to the microwave generator via a transmission element.

To generate electromagnetic fields in the microwave range (e.g., at a frequency in the range between approximately 0.3 and 300 GHz), microwave generators in the form of space-charge-wave tubes (e.g., a magnetron or klystron) may be used. A space-charge-wave tube such as this enables outputs in the megawatt range to be achieved (e.g., by supplying the space-charge-wave tube with a pulsed supply current). Such fields are used, for example, in electron linear accelerators, as are used in medical engineering, to accelerate an electron beam.

With an arrangement of equipment of this type, it is, for example, a complex matter to implement an effective transmission of the current pulses from the pulse generator to the microwave generator.

The reason for this is that the electrical properties of a space-charge-wave tube (e.g., a magnetron) may change abruptly if the supply voltage (e.g., a break-through voltage) exceeds a threshold. A close approximation of the circuit engineering behavior of a magnetron may be described by an equivalent circuit diagram, in which a switch with a downstream ohmic resistance is connected in parallel to an attenuated series resonant circuit. The operation of the magnetron at a supply voltage undershooting the break-through voltage corresponds to a state of the equivalent circuit diagram, in which the switch is open. In this operating state (e.g., standby mode), the magnetron essentially acts as a series resonant circuit in the supply current circuit.

Exceeding the break-through voltage corresponds in the equivalent circuit diagram to closing the switch. In this second operating state or operating mode, the magnetic current essentially acts in the supply current circuit as an ohmic resistance having an impedance that is low-resistance compared to the impedance of the series resonant circuit.

In pulse operation of a magnetron, the break-through voltage is temporarily exceeded with every current pulse or every voltage pulse, which in the equivalent circuit diagram, equates to a temporary closure of the switch. Every time the break-through voltage is exceeded or undershot, the result is an abrupt change in the load, which the magnetron represents in the supply current circuit. These abrupt changes in load or impedance result, in the absence of special precautions, in undesired fluctuations in the time characteristic of the supply current that supplies the magnetron.

In order to suppress these current fluctuations as much as possible, impedance matching of the supply current circuit may be performed. Impedance matching may be effected by connecting a dynamic load (e.g., a capacitor) in parallel to the magnetron.

One disadvantage of this solution is that the components connected into the supply current circuit for impedance matching are to be individually aligned with the other components of the supply current circuit (e.g., the pulse generator and the magnetron) that significantly impedes a flexible design of the structure. Accordingly, one of these components may not be replaced (e.g., a given individual magnetron or a given individual pulse generator) without again performing impedance matching. The components aligned with one another may not be moved without impairing the impedance matching (e.g., if, as a result, the transmission path (the length of the transmission element) is decreased or increased).

In addition or alternatively to separate circuit components for impedance matching, an RC network (e.g., attenuation network) may be connected in parallel to the magnetron and limits the voltage rise to a value specified by the manufacturer for the magnetron in question. Thanks to the attenuation network, an excessively fast voltage rise, to which the magnetron would respond with tube surges and malfunctions on commencement of the oscillation, may be prevented. By correctly adjusting the attenuation network, an excessively slow voltage rise, which would not result in the commencement of the oscillation and which would cause increased losses in the tube, may be avoided. However, the parts for the attenuation network generate additional costs and account for a certain risk that the magnetron will fail during operation.

SUMMARY AND DESCRIPTION

The present embodiments may obviate one or more of the drawbacks or limitations in the related art. For example, a more flexible solution for electrical matching of an arrangement of equipment with a microwave generator and a pulse generator connected to the microwave generator via a transmission element is provided.

One embodiment of the method is used to operate an arrangement of equipment that includes a pulse generator, a microwave generator, and a transmission element. The pulse generator is, for example, used to generate current pulses or voltage pulses for the microwave generator, and is connected to the microwave generator for the transmission of the current pulses or voltage pulses via the transmission element. Within the supply current circuit formed by the pulse generator, the microwave generator and the transmission element, the transmission element forms a dynamic impedance (e.g., an impedance change is effected during the pulse time characteristic).

A space-charge-wave tube (e.g., a magnetron or klystron) may be used as a microwave generator. The circuit engineering behavior of the space-charge-wave tube is characterized by a standby mode and an operating mode and abruptly changes if a break-through voltage is exceeded.

In operation of the arrangement of equipment, each of the voltage pulses or current pulses is set with a voltage characteristic or current intensity characteristic that changes over time such that the impedance of the transmission element is matched to the impedance of the microwave generator in operating mode when the break-through voltage is reached (e.g., is precisely or at least approximately aligned). The set voltage characteristic or current intensity characteristic may, for example, be identical in the normal mode of the arrangement of equipment for all voltage pulses or current pulses.

In one embodiment, the impedance matching of the arrangement of equipment is thus achieved not only by circuit-engineering measures (e.g., by a corresponding selection and dimensioning of the circuit hardware), but at least also by selectively setting the pulse shape of the voltage pulses or of the current pulses. The term "voltage characteristic or current intensity characteristic that changes over time" may be, for example, the effect that the voltage pulses or the current pulses are not generated as simple rectangular pulses, but the voltage characteristic or current intensity characteristic during the pulse is aligned by corresponding control or regulation of the pulse generator to a defined function (e.g., reference characteristic) with a value that changes as a function of time. In one embodiment, the arrangement of equipment does not include a separate attenuation network (e.g., formed from discrete electronic components such as capacitors or resistors). Instead, the speed of the voltage rise specified for the microwave generator is also provided by correspondingly adjusting the pulse shape of the voltage pulses or of the current pulses.

In one embodiment, the method includes a calibration mode in addition to the normal mode described above. During the calibration mode, the pulse shape of the voltage pulses or of the current pulses (e.g., the voltage characteristic or current intensity characteristic over time of each pulse compared to an initial pulse shape such as a previous reference characteristic) is varied such that the impedance of the transmission element is matched to the impedance of the microwave generator in operating mode when the break-through voltage is reached. The purpose of the calibration mode is, for example, to determine a new reference characteristic of the voltage or current intensity of the pulse, to which the pulse shape is set in the subsequent normal mode. The reference characteristic may be determined in calibration mode by calculation or simulation on the basis of known electrical properties of the components of the supply circuit. In one embodiment, in an iterative optimization procedure, the reference characteristic is determined by gradually changing the pulse shape starting from the initial pulse shape until an optimum impedance matching is achieved in the context of a defined termination condition. A combination of both variants of the calibration mode, in which, for example, the initial pulse shape (e.g., basic matching) is determined by calculation or simulation and is then iteratively refined, may be provided.

The calibration mode may essentially be effected in whole or in part by manually changing the pulse shape. However, in one embodiment of the method, the calibration mode runs fully automatically (e.g., without any interaction with a human user). The calibration mode may be performed not only when the arrangement of equipment is commissioned, but is also repeated during operation of the existing arrangement of equipment at intervals in time.

Essentially, the voltage characteristic or current intensity characteristic over time may be continuously changed during every pulse. The pulses have a "smooth" pulse shape without abrupt voltage and current changes (e.g., current characteristic and voltage characteristic of the microwave generator) after the break-through voltage is reached. However, because implementation is easier, the pulse shape may be generated by a superposition of several voltage jumps offset against one another in time. The individual voltage jumps are, for example, advantageously implemented by controlled discharge of an assigned charge-coupled memory. This type of pulse generation is, for example, advantageous when high outputs (e.g., to generate microwave radiation in the megawatt range) are to be achieved.

In one embodiment, one- or multi-stage impulse generators (e.g., Marx generators) are provided as a charge-coupled memory, the impulse or Marx generators being connected in cascade fashion offset in time to implement a voltage jump in each case.

In one embodiment, the pulse shape is set such that the voltage characteristic or current intensity characteristic over time rises monotonously during every pulse at least until reaching the break-through voltage (e.g., in the mathematical sense). In one embodiment, the rise in the voltage or current intensity is linear. When the characteristic of the voltage changes in stepped fashion, the voltage jumps, and integrities are selected such that the voltage rises linearly on average over time via one or more voltage jumps. For example, the voltage characteristic has several voltage jumps during the pulse, each with a same jump height and a same jump interval over time.

The control unit is used to trigger the pulse generator. In circuit-engineering and/or programming terms, the control unit is configured to automatically execute one of the embodiments of the method described above. The control unit is thus, for example, configured such that when operating as intended, the control unit triggers the pulse generator to generate current pulses with the defined voltage characteristic or current intensity characteristic that changes over time.

The control unit includes, for example, a microcontroller with a control program implemented in the microcontroller using software that, when run automatically, executes the method described above.

The control unit may be configured as an integral part of the arrangement of equipment described above (e.g., of the pulse generator). The control unit may, however, also be manufactured and marketed as a component separate from the other components of the arrangement of equipment.

The transmission element may be formed by a simple electrical line (e.g., in the form of a coaxial cable). In one embodiment, the transmission element additionally includes a transformer (e.g., a contactless power transmission pulse transformer (CPT pulse transformer)). A transmission element configured in this way is, for example, advantageous if some of the components of the arrangement of equipment are rotatable with respect to the other components of the arrangement of equipment (e.g., if the arrangement of equipment is partly disposed in the rotating assembly of a gantry of a medical diagnostic or treatment device).

In a further embodiment that is provided, for example, for a use of the arrangement of equipment in the gantry of a medical diagnostic or treatment device, the transmission element includes a slipring (e.g., a ring-shaped sliding contact), as is customarily used for transmitting energy and/or signals between the stationary part and the rotating assembly of such a gantry.

DETAILED DESCRIPTION OF THE DRAWINGS

Figure 1:
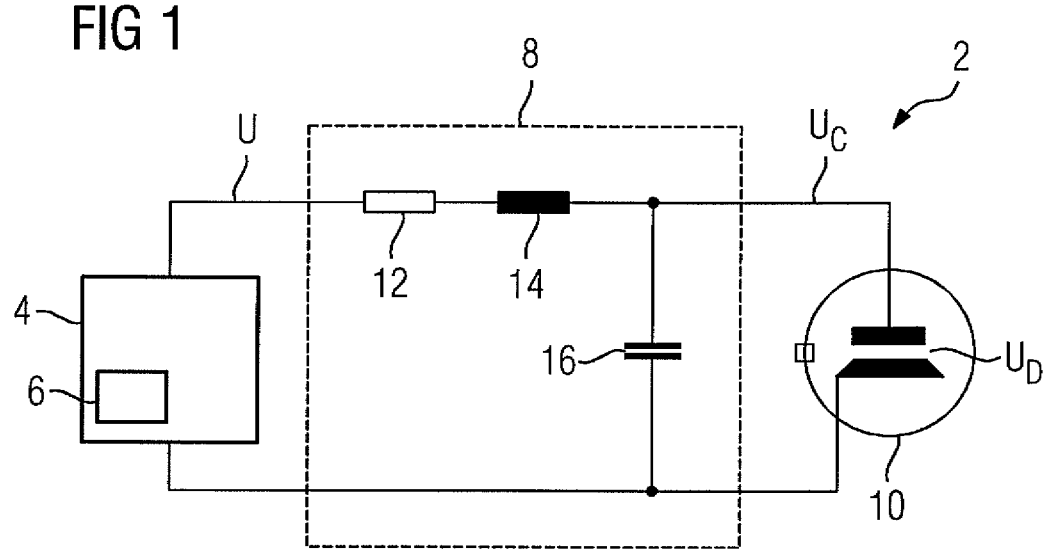
FIG. 1 shows one embodiment of an arrangement of equipment formed from a pulse generator, a transmission element and a microwave generator in the form of a magnetron.

Parts corresponding to one another are always provided with the same reference characters in all figures.

FIG. 1 shows one embodiment of an arrangement of equipment 2 that includes a pulse generator 4 with a control unit 6 integrated in the pulse generator 4, a transmission element 8, and a magnetron 10 used as a microwave generator. The arrangement of equipment 2 is used to generate an electromagnetic field in the microwave range that is used to accelerate an electron beam in a medical linear accelerator (not shown).

In connection with the arrangement of equipment 2, the pulse generator 4 is used to generate pulses (e.g., current pulses) for the magnetron 10. The transmission element 8 is used to transmit the pulses and is accordingly connected between the pulse generator 4 and the magnetron 10. The electrical circuit formed by the pulse generator 4, the transmission element 8, and the magnetron 10 is also referred to below as a supply current circuit. The pulse generator 4 includes several (e.g., twenty) Marx generators that may each be independently triggered connected in series.

The control unit 6 integrated into the pulse generator 4 is used to trigger the pulse generator 4. A microcontroller (not explicitly shown) of the control device 6 implements a control program using software.

The circuit-engineering behavior of the transmission element 8 may, in a close approximation, be described by an equivalent circuit diagram, in which an ohmic resistance 12, a stray inductance 14, and a stray capacitance 16 form a two-port network that corresponds to a passive, second-order lowpass. The ohmic resistance 12, the stray inductance 14 and the stray capacitance 16 are effectively active variables, into which, for example, the impedances of several components may also be incorporated in each case. In the exemplary embodiment, the transmission element 8 is, for example, implemented by a transformer and an electrical line, so that the resistance 12 represents a linear combination of the ohmic resistance of the line and of the ohmic resistance of the transformer, while the stray inductance 14 is made up of the inductance of the transformer and of the inductance of the line.

Figure 2:
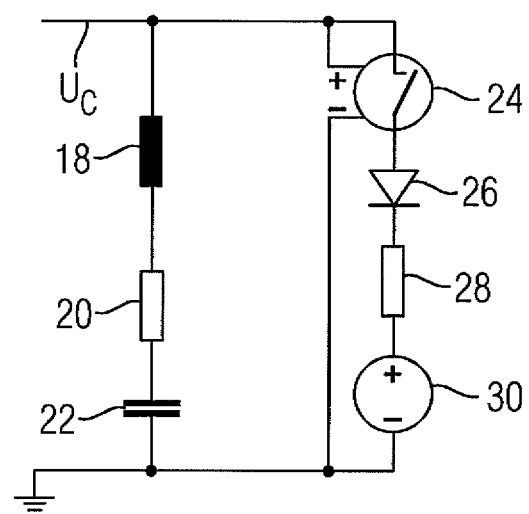
FIG. 2 shows an exemplary equivalent circuit diagram for the magnetron.

The circuit-engineering behavior of the magnetron 10 may be approximately described by the equivalent circuit diagram according to FIG. 2 described in the introduction. In this equivalent circuit diagram, an inductance 18, an ohmic resistance 20, and a capacitance 22 form a series resonant circuit that determines the behavior of the magnetron 10 in the standby mode defined in the introduction. Series-connected in parallel to the series resonant circuit are a voltage-controlled switch 24, a diode 26, an ohmic resistance 28, and a voltage source 30. This branch of the equivalent circuit diagram determines the electrical behavior in the operating mode of the magnetron 10 defined in the introduction. The switch 24, opened in standby mode and closed in operating mode, symbolizes, in the equivalent circuit diagram, the electrical break-through of the magnetron 10 that occurs when the voltage $U_C$ (e.g., supply voltage) applied to the magnetron 10 from the transmission element 8 exceeds a defined break-through voltage $U_D$. The break-through voltage $U_D$ of the magnetron 10 is, for example, 32 kV.

As is apparent from the equivalent circuit diagrams FIGS. 1 and 2, the rise over time of the supply voltage $U_C$ applied to the magnetron 10 is, in the case of a current pulse with an approximately rectangular voltage characteristic generated by the pulse generator 4, initially delayed by the lowpass effect of the transmission element 8. As a result, the magnetron 10 remains in standby mode in a first phase of the pulse. Towards the end of this first pulse phase, the impedance of the stray capacitance 16 rises as time progresses because of the increasing charge. Accordingly, the supply voltage $U_C$ applied to the magnetron 10 increases until, at a break-through time, the supply voltage $U_C$ exceeds the break-through voltage $U_D$.

At the break-through time of the magnetron 10, at which the magnetron 10 switches to operating mode, the overall impedance of the supply current circuit changes suddenly if impedance matching is absent or defective. This may provoke a considerable jump in the current intensity in the supply circuit.

To eliminate or at least reduce this undesired effect, the control unit 6 triggers the pulse generator 4 to generate pulses, in the course of which the value of the pulse voltage U output by the pulse generator 4 changes over time in accordance with a stored reference characteristic. The reference characteristic of the pulse voltage is, for example, selected such that the impedance of the stray capacitance 16 corresponds at the break-through time precisely or at least approximately to the impedance (e.g., largely constant) of the magnetron 10 in an operating mode (e.g., dimensioned at approximately 400Ω).

As a result of the impedance matching, the magnetron 10 during the break-through takes over the supply current previously injected into the stray inductance 14. As a result, abrupt fluctuations in the current intensity are prevented. Even disruptive reflections of the supply voltage $U_C$ are prevented, as would occur in the event of incorrect output matching between the pulse generator 4 and the magnetron 10.

The speed of the voltage rise is matched by the control unit 6 to a value range specified for the magnetron 10 (e.g., adjusted to a value between 80 kV/μs and 120 kV/μs, by correspondingly adjusting the pulse shape of the voltage pulses or of the current pulses).

In normal operating mode, the control unit 6, when running a normal operating routine of the control program, accordingly triggers the pulse generator 4 to generate all pulses with an identical pulse shape corresponding to the stored reference characteristic of the pulse voltage U. In one embodiment, the control unit 6 accordingly triggers the pulse generator 4, for example, to increase the pulse voltage U during each pulse in several (e.g., twenty) identical stages equidistant in time (e.g., voltage jumps). As a result, the pulse voltage U rises linearly on average over time.

Alternatively to this normal operating mode, the control unit 6, when running a calibration routine of the control program, may be operated in a calibration mode, in which the cited reference characteristic of the pulse voltage U is determined iteratively.

In calibration mode, the control unit 6 initially generates a pulse with a defined start characteristic of the pulse voltage U in a zero-th iteration step by accordingly triggering the pulse generator 4. This start characteristic corresponds, for example, to the stepped linear voltage increase described above. The control unit 6 uses a defined start value for the time interval between two voltage jumps (e.g., step values). The control unit 6, for example, measures the jump in the current intensity that occurs when the break-through voltage $U_D$ is exceeded and stores this variable as a target value.

In subsequent further iterations, the control unit 6 generates further pulses with a qualitatively identical characteristic of the pulse voltage U, but modified step values in each case.

Thus, in each iteration, the increase in the linear voltage rise, on average, is changed over time. In each iteration, the control unit 6 measures the current intensity jump when the break-through voltage $U_D$ is exceeded as a new target value. The control unit 6, for example, modifies the step values (e.g., using the Newton method) such that the target value is minimized.

The calibration mode is aborted if a defined termination condition is met (e.g., if the target variable undershoots a defined threshold). The last value of the step values is stored by the control unit 6 as a new reference value that defines the reference characteristic of the pulse voltage U for the subsequent normal mode. The physical basis for the voltage-controlled impedance matching described above is explained below in greater detail. A rectangular characteristic of the pulse voltage U is initially assumed (e.g., a characteristic of the pulse voltage U=U(t)) proportional to a jump function $\theta(t)$:

$$U(t)=U_0\theta(t) \qquad \text{Eq. 1}$$

where $U_o$=constant. According to the equivalent circuit diagram in FIG. 1, the time characteristic arising in this case of the supply voltage $U_C=U_C(t)$ dropping across the stray capacitance 16 in the event of a magnetron 10 being disconnected is:

$$U_C(t) = U_0\left[1 - E\cos\left(\frac{1}{2}\omega t\right) - \frac{ER\sin\left(\frac{1}{2}\omega t\right)}{L\omega}\right] \qquad \text{Eq. 2}$$

and the time characteristic of the real part $R_C=R_C(t)$ of the impedance of the stray capacitance 16 is:

$$R_C(t) = \frac{1 - E\cos\left(\frac{1}{2}\omega t\right) - \frac{ER\sin\left(\frac{1}{2}\omega t\right)}{L\omega}}{\frac{2RE\sin\left(\frac{1}{2}\omega t\right)}{L\omega}} \qquad \text{Eq. 3}$$

where $$\omega = \sqrt{-\frac{4L\,|\,R^2 C}{L^2 C}} \qquad \text{Eq. 4}$$

and $$E = e^{\left(-\frac{Rt}{2L}\right)} \qquad \text{Eq. 5}$$

Figure 3:
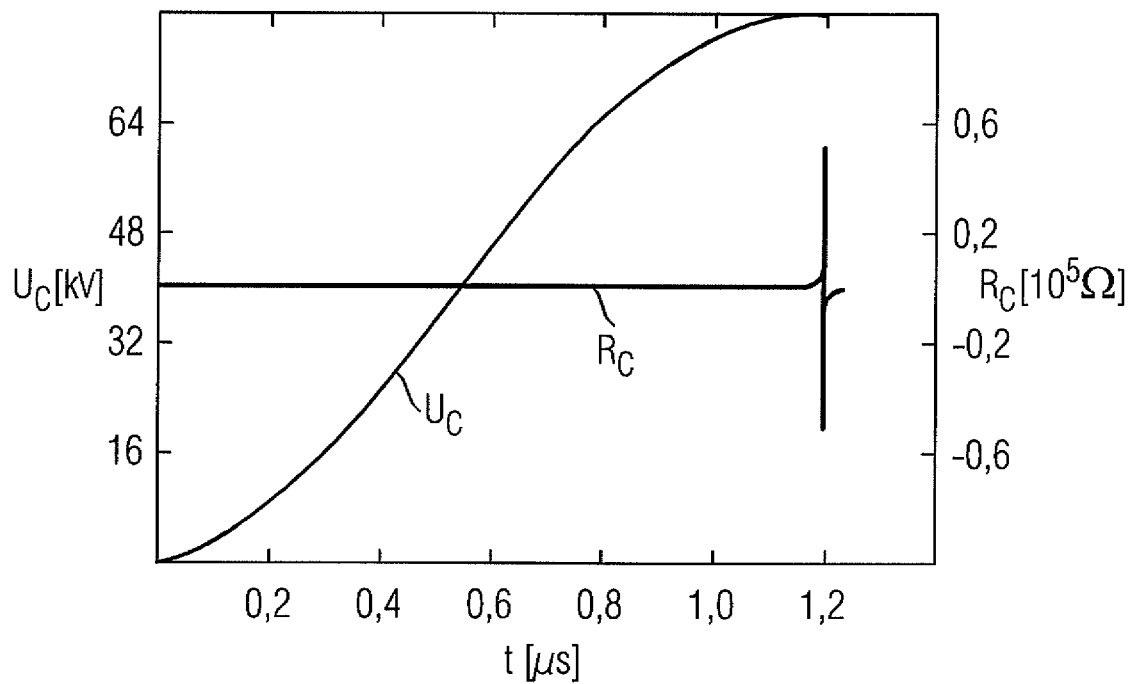
FIG. 3 shows an exemplary time characteristic of an impedance of a stray capacitance of the transmission element and of a voltage dropping across the stray capacitance when a rectangular pulse voltage is applied.

The time characteristic of the real part $R_C$ is contrasted in FIG. 3 with the time characteristic of the voltage $U_C$.

Figure 4:
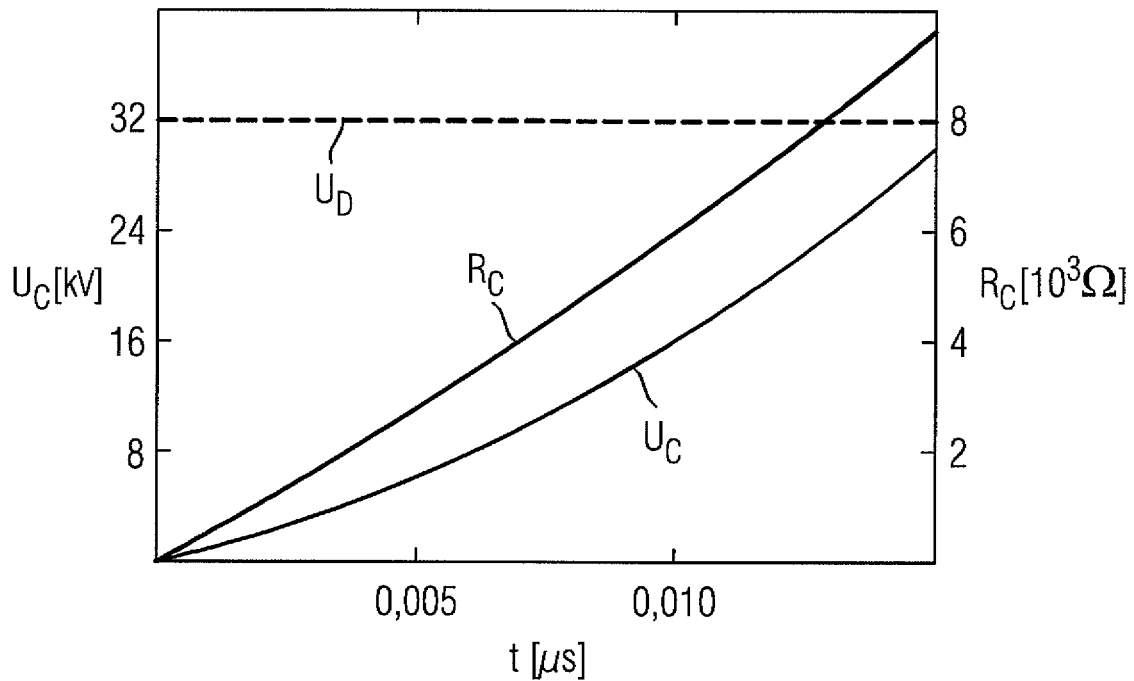
FIG. 4 shows an exemplary time characteristic of the impedance and of the voltage dropping across the stray capacitance at a value of the stray capacitance of 800 fF when a rectangular pulse voltage is applied.

If for the stray capacitance 16, a value of approximately 800 fF is applied, for the resistance 12, a value of approximately 1Ω is applied, and for the inductance, a value of approximately 170 µH is applied, the real part $R_C$ and the voltage $U_C$ adopt the characteristic shown in FIG. 4 immediately after the application of the pulse voltage U. FIG. 4 shows that the real part $R_C$ is already over 10Ω at the time at which the voltage $U_C$ reaches the break-through voltage $U_D$ and thus differs very significantly from the impedance of the magnetron 10 in operating mode (e.g., approximately 400Ω).

Figure 5:
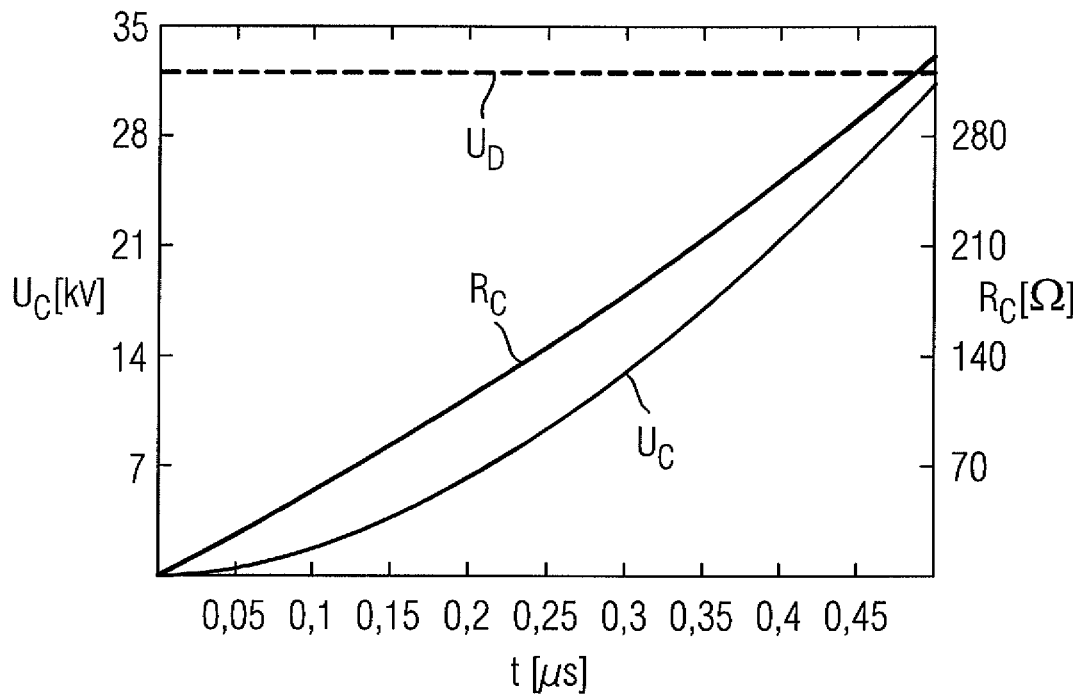
FIG. 5 shows an exemplary time characteristic of the impedance and of the voltage dropping across the stray capacitance at a value of the stray capacitance of 800 pF when a rectangular pulse voltage is applied.
Figure 6:
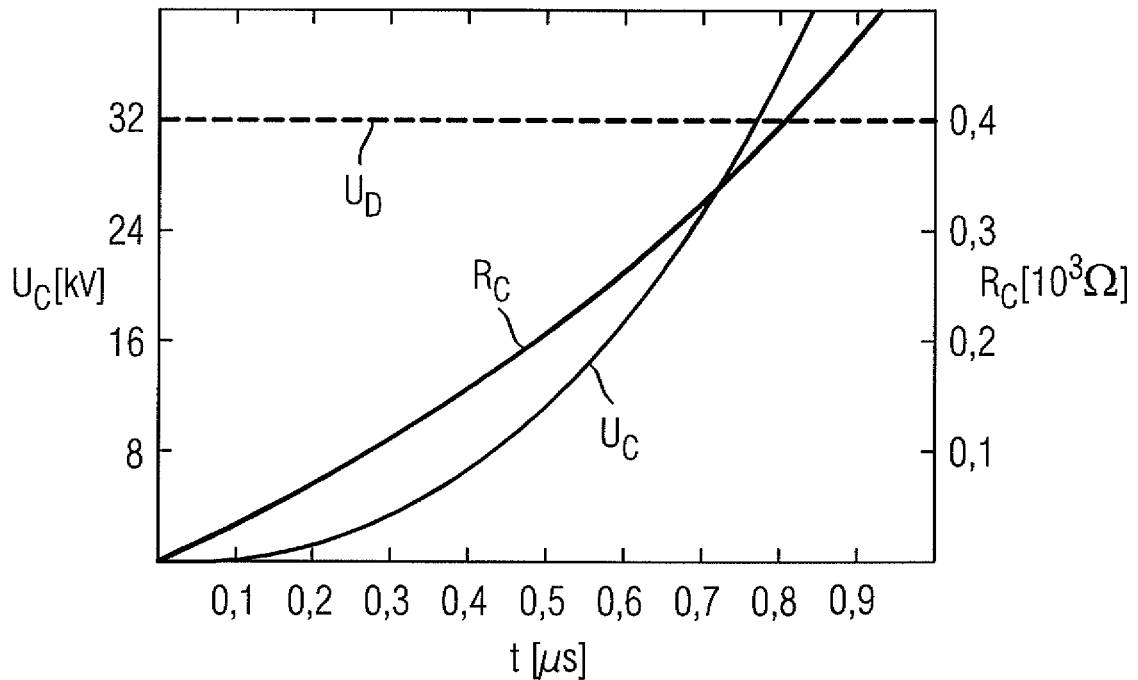
FIG. 6 shows an exemplary time characteristic of the impedance and of the voltage dropping across the stray capacitance at a value of the stray capacitance of 800 fF when a linearly rising pulse voltage is applied.

One option for reducing this deviation is to favorably dimension the circuit engineering of the transmission element 8. By way of example, the characteristic of the real part $R_C$ and of the voltage $U_C$ is simulated in FIG. 5 for the event, where the stray capacitance 16 has a value of 800 pF. When the break-through voltage $U_D$ is reached (e.g., at $U_D=U_C$), the real part $R_C$ is approximately 300Ω and thus lies in an acceptable range.

Providing the pulses are output by the pulse generator 4 not as rectangular pulses but with a linearly rising characteristic over time of the pulse voltage U, $$U(t)=U_1 t \qquad \text{Eq. 6}$$

where rise $U_1$=constant to the transmission element 8, the voltage $U_C$ is:

$$U_C(t) = U_1\left[-RC + t + CER\cos\left(\frac{1}{2}\omega t\right) - \frac{2E\sin\left(\frac{1}{2}\omega t\right)}{\omega} + \frac{CER^2\sin\left(\frac{1}{2}\omega t\right)}{L\omega}\right] \qquad \text{Eq. 7}$$

and the real part $R_C$ of the impedance of the stray capacitance 16 is:

$$R_C(t) = \frac{-RC + t + CE\cos\left(\frac{1}{2}\omega t\right) - \frac{2E\sin\left(\frac{1}{2}\omega t\right)}{\omega} + \frac{CER^2\sin\left(\frac{1}{2}\omega t\right)}{L\omega}}{C\left[1 - E\cos\left(\frac{1}{2}\omega t\right) - \frac{ER\sin\left(\frac{1}{2}\omega t\right)}{L\omega}\right]} \qquad \text{Eq. 8}$$

where the variables ω and E are determined by Eq. 4 or 5.

Assuming, similarly to FIG. 4, an intrinsically unfavorable value for the stray capacitance 16 of approximately 800 fF, then as a result of the changed characteristic of the pulse voltage U, the real part $R_C$ at the time, at which the voltage $U_C$ reaches the break-through voltage $U_D$, may be brought to an acceptable range of approximately 350Ω to 400Ω. For the rise $U_1$ in the pulse voltage U used in Eq. 6, a value of 70 kV/µs was chosen by way of example.

Figure 7:
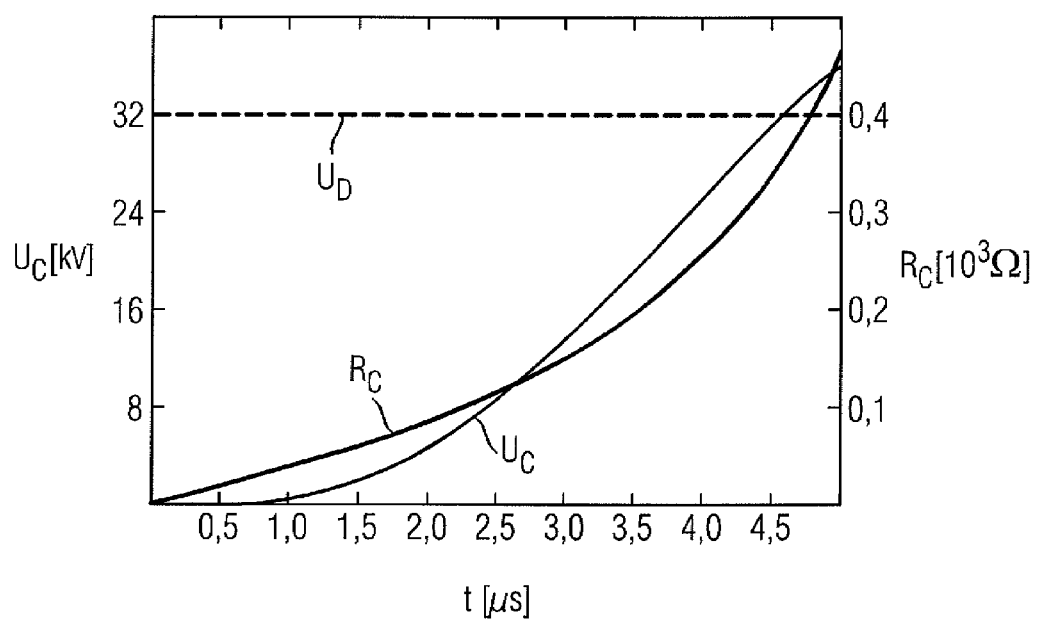
FIG. 7 shows an exemplary time characteristic of the impedance and of the voltage dropping across the stray capacitance when a linearly rising pulse voltage is applied with modified properties of the transmission element and a modified voltage rise.

For comparison, FIG. 7 shows the time characteristic of the voltage $U_C$ and of the real part $R_C$ in the case of a linear voltage rise $U_1$ of 9 kV/µs. For the stray capacitance 16, a value of approximately 7.5 nF is defined, for the resistance 12, a value of approximately 1.5Ω is defined, and for the inductance, a value of approximately 180 µH is defined. As a result, a transmission element with a 15 m long line may be simulated.

The invention is not restricted to the exemplary embodiments described above. Other variants may also be derived by the person skilled in the art without departing from the subject matter of the invention. For example, all individual features described in connection with the exemplary embodiments may also be combined with one another in another way, without departing from the subject matter of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating an arrangement of equipment that comprises a pulse generator for generating electrical pulses, a microwave generator with a break-through voltage, and a transmission element, wherein the pulse generator is connected to the microwave generator for transmission of the electrical pulses via the transmission element, the transmission element acting in the arrangement of equipment as an impedance varying over time, the method comprising:

setting each of the electrical pulses with a voltage characteristic that changes over time or a current intensity characteristic that changes over time such that the impedance of the transmission element is matched in operating mode to an impedance of the microwave generator when the break-through voltage is reached.

2. The method as claimed in claim 1, further comprising varying, in a calibration mode, the voltage characteristic of the pulses over time or the current intensity characteristic of the pulses over time such that the impedance of the transmission element is matched in the operating mode to the impedance of the microwave generator when the break-through voltage is reached.

3. The method as claimed in claim 1, further comprising generating the voltage characteristic of the pulses over time by a superposition of a plurality of voltage jumps offset in time against one another,
wherein each voltage jump of the plurality of voltage jumps is implemented by a controlled discharge of a charge-coupled memory.

4. The method as claimed in claim 1, wherein the voltage characteristic over time is characterized by a linear rise, at least on average, over time.

5. The method as claimed in claim 1, further comprising adjusting the voltage characteristic over time by correspondingly adjusting a pulse shape of the voltage pulses or of the current pulses such that a speed of the voltage rise corresponds to a value specified for the microwave generator.

6. The method as claimed in claim 2, further comprising generating the voltage characteristic of the pulses over time by a superposition of a plurality of voltage jumps offset in time against one another,
wherein each voltage jump of the plurality of voltage jumps is implemented by a controlled discharge of a charge-coupled memory.

7. The method as claimed in claim 2, wherein the voltage characteristic over time is characterized by a linear rise, at least on average, over time.

8. The method as claimed in claim 3, wherein the voltage characteristic over time is characterized by a linear rise, at least on average, over time.

9. A control unit for triggering a pulse generator for generating electrical pulses, wherein the pulse generator is connected to a microwave generator for transmission of the electrical pulses via a transmission element, the transmission element acting as an impedance varying over time, the microwave generator having a break-through voltage, the control unit being configured to:
set each of the electrical pulses with a voltage characteristic that changes over time or a current intensity characteristic that changes over time such that the impedance of the transmission element is matched in operating mode to an impedance of the microwave generator when the break-through voltage is reached.

10. An arrangement of equipment comprising:
a pulse generator;
a microwave generator having a break-through voltage;
a transmission element connected between the pulse generator and the microwave generator for transmission of electrical pulses, the transmission element acting as an impedance varying over time; and
a control unit for triggering the pulse generator for generating the electrical pulses, the control unit being configured to:
set each of the electrical pulses with a voltage characteristic that changes over time or a current intensity characteristic that changes over time such that the impedance of the transmission element is matched in operating mode to an impedance of the microwave generator when the break-through voltage is reached.

11. The arrangement of equipment as claimed in claim 10, wherein the pulse generator comprises one or more Marx generators.

12. The arrangement of equipment as claimed in claim 10, wherein the microwave generator comprises a magnetron, a klystron, a gyrotron or an amplitron.

13. The arrangement of equipment as claimed in claim 10, wherein the transmission element comprises a transformer.

14. The arrangement of equipment as claimed in claim 13, wherein the transformer comprises a contactless power transmission pulse transformer.

15. The arrangement of equipment as claimed in claim 10, wherein the arrangement of equipment does not have a separate attenuation network, and
wherein the control unit is configured to adjust a speed of a voltage rise specified for the microwave generator by correspondingly adjusting a pulse shape of the voltage pulses or of the current pulses.

16. The arrangement of equipment as claimed in claim 11, wherein the microwave generator comprises a magnetron, a klystron, a gyrotron or an amplitron.

17. The arrangement of equipment as claimed in claim 11, wherein the transmission element comprises a transformer, in particular a contactless power transmission pulse transformer.

18. The arrangement of equipment as claimed in claim 12, wherein the transmission element comprises a transformer, in particular a contactless power transmission pulse transformer.

19. The arrangement of equipment as claimed in claim 11, wherein the arrangement of equipment does not have a separate attenuation network, and
wherein the control unit is configured to adjust a speed of a voltage rise specified for the microwave generator by correspondingly adjusting a pulse shape of the voltage pulses or of the current pulses.

20. The arrangement of equipment as claimed in claim 12, wherein the arrangement of equipment does not have a separate attenuation network, and
wherein the control unit is configured to adjust a speed of a voltage rise specified for the microwave generator by correspondingly adjusting a pulse shape of the voltage pulses or of the current pulses.

* * * * *